United States Patent
Miyaji (10) Patent No.: US 7,287,200 B2
(45) Date of Patent: Oct. 23, 2007

(54) JITTER APPLYING CIRCUIT AND TEST APPARATUS

(75) Inventor: Yuichi Miyaji, Tokyo (JP)

(73) Assignee: Advantest Corporation, Tokyo (JP)

( * ) Notice: Subject to any disclaimer, the term of this patent is extended or adjusted under 35 U.S.C. 154(b) by 138 days.

(21) Appl. No.: 11/178,226

(22) Filed: Jul. 8, 2005

(65) Prior Publication Data

US 2006/0041797 A1 Feb. 23, 2006

Related U.S. Application Data

(63) Continuation of application No. PCT/JP05/11589, filed on Jun. 24, 2005.

(30) Foreign Application Priority Data

Jul. 22, 2004 (JP) ............................. 2004-214888

(51) Int. Cl.
  *G11B 20/20* (2006.01)
  *H03L 7/06* (2006.01)
  *G06F 11/00* (2006.01)
(52) U.S. Cl. .................... 714/700; 714/798; 327/158
(58) Field of Classification Search ................ 714/798; 327/158, 244
  See application file for complete search history.

(56) References Cited

U.S. PATENT DOCUMENTS 6,522,122 B2* 2/2003 Watanabe et al. ........ 324/76.77
6,621,352 B2* 9/2003 Matsumoto et al. ........ 331/1 A
6,686,879 B2* 2/2004 Shattil ........................ 342/367
7,142,624 B2* 11/2006 Cranford et al. ............ 375/376
2003/0231707 A1* 12/2003 French et al. ............... 375/226

FOREIGN PATENT DOCUMENTS

| JP | 2-252316 | 10/1990 |
| JP | 6-104708 | 4/1994 |
| JP | 6-112785 | 4/1994 |
| JP | 2002124873 A * | 4/2002 |

OTHER PUBLICATIONS

Alvarez et al. A wide-bandwidth low-voltage PLL for Power PCTM microprocessors, Solid-State Circuits, IEEE Journal of vol. 30, Issue 4, Apr. 1995 pp. 383-391.*
International Search Report dated Aug. 2, 2005 (2 pages).

* cited by examiner

*Primary Examiner*—Cynthia Britt
(74) *Attorney, Agent, or Firm*—Osha Liang LLP (57) ABSTRACT

There is provided a jitter application circuit for generating a clock signal containing a phase jitter component corresponding to given jitter data, having a PLL circuit for generating an oscillating signal corresponding to a given reference signal, a variable delay circuit for outputting said clock signal in which said oscillating signal is delayed, a low-frequency application section for applying low-frequency component of said phase jitter component to said oscillating signal by controlling oscillation frequency of said PLL circuit based on the low-frequency component of said jitter data and a high-frequency application section for applying high-frequency component of said phase jitter component to said clock signal by controlling a delay in said variable delay circuit based on the high-frequency component of said jitter data.

10 Claims, 6 Drawing Sheets

JITTER APPLYING CIRCUIT AND TEST APPARATUS

The present application is a continuation application of PCT/JP2005/011589 filed on Jun. 24, 2005 which claims the priority from Japanese Patent Application No. 2004-214888 filed on Jul. 22, 2004 and whose content is incorporated in the present application by reference as part of description thereof.

BACKGROUND OF THE INVENTION

1. Field of the Invention

The present invention relates to a jitter application circuit for generating a clock signal containing a phase jitter component corresponding to given jitter data and a test apparatus for testing jitter resistance of electronic devices.

2. Related Art

Conventionally, as a circuit for applying jitter into a clock signal, there has been known a jitter applying device that controls a delay of a variable delay circuit for delaying and outputting such clock signal corresponding to jitter to be given. The applicant of the present application has proposed a jitter applying device that controls the delay of the variable delay circuit using shift registers corresponding to jitter to be given as disclosed in Japanese Patent Laid-Open No. 2003-235718 for example. Other applicants have also proposed a jitter applying device using the variable delay circuit as disclosed in Japanese Patent Laid-Open No. 2003-125010 for example.

However, it has been difficult to apply large-amplitude and high-resolution jitter by the conventional jitter applying devices. When the shift resisters are used for the variable delay circuit for instance, a very large number of registers must be used to apply large-amplitude and high-resolution jitter, increasing the circuit scale enormously. The same problem also occurs even when another configuration is used for the variable delay circuit.

Still more, in case of generating an oscillating signal containing a jitter component by superimposing the jitter component to control voltage of a voltage controlled oscillator of a PLL circuit, high-frequency jitter cannot be applied because the control voltage is supplied to the voltage controlled oscillator via a low-pass filter.

SUMMARY OF INVENTION

Accordingly, it is an object of the invention to provide a jitter application circuit and a test apparatus that are capable of solving the above-mentioned problems. This object may be achieved through the combination of features described in independent claims of the invention. Dependent claims thereof specify preferable embodiments of the invention.

In order to solve the above-mentioned problems, according to a first aspect of the invention, there is provided a jitter application circuit for generating a clock signal containing a phase jitter component corresponding to given jitter data, having a PLL circuit for generating an oscillating signal corresponding to a given reference signal, a variable delay circuit for outputting the clock signal of the delayed oscillating signal, a low-frequency application section for applying a low-frequency component of the phase jitter component to the oscillating signal by controlling oscillation frequency of the PLL circuit based on the low-frequency component of the jitter data and a high-frequency application section for applying a high-frequency component of the phase jitter component to the clock signal by controlling a delay in the variable delay circuit based on the high-frequency component of said jitter data.

Preferably, the PLL circuit has a voltage controlled oscillator for generating the oscillating signal having frequency corresponding to given control voltage, a phase comparator for generating the control voltage based on the result of comparison of the phase of the given reference signal and the phase of the oscillating signal and a low-pass filter for removing high-frequency component of the control voltage to give to the voltage controlled oscillator, and the low-frequency application section superimposes voltage corresponding to the jitter data to the control voltage generated by the phase comparator to input to the low-pass filter.

The high-frequency application section may have a high-pass filter for sampling the high-frequency component of the jitter data. The low-frequency application section has a low-pass filter for sampling a low-frequency component of the jitter data. The jitter data may be digital data of a plurality of bits, the high-frequency application section may control a delay in the variable delay circuit based on a low-order bit of a predetermined digit of the jitter data and the low-frequency application section may control oscillation frequency of the PLL circuit based on upper-order bit of a predetermined digit of the jitter data.

Preferably, the PLL circuit has a voltage controlled oscillator for generating the oscillating signal having frequency corresponding to given control voltage, a phase comparator for generating the control voltage based on a result of comparison of phase of a given reference signal and phase of the clock signal outputted from the variable delay circuit and a low-pass filter for removing high-frequency component of the control voltage to give to the voltage controlled oscillator.

According to a second aspect of the invention, there is provided a test apparatus for testing jitter resistance of an electronic device, having a pattern generator for generating a test pattern for testing the electronic device, a timing generator for generating a clock signal containing a phase jitter component corresponding to given jitter data and a waveform forming device for inputting the test signal based on the test pattern to the electronic device with timing corresponding to the clock signal, and the timing generator has a PLL circuit for generating an oscillating signal corresponding to a given reference signal, a variable delay circuit for outputting the clock signal in which the oscillating signal is delayed, a low-frequency application circuit for controlling oscillation frequency of the PLL circuit based on the low-frequency component of the jitter data to apply the low-frequency component of the phase jitter component to the oscillating signal and a high-frequency application section for controlling a delay in the variable delay circuit based the high-frequency component of the jitter data to apply the high-frequency component of the phase jitter component to the clock signal.

It is noted that the summary of the invention described above does not necessarily describe all necessary features of the invention. The invention may also be a sub-combination of the features described above.

According to the invention, broad-band, high-resolution and large-amplitude phase jitter component may be readily applied to the clock signal.

DETAILED DESCRIPTION OF THE INVENTION

The invention will now be described based on preferred embodiments, which do not intend to limit the scope of the invention, but exemplify the invention. All of the features and the combinations thereof described in the embodiments are not necessarily essential to the invention.

Figure 1:
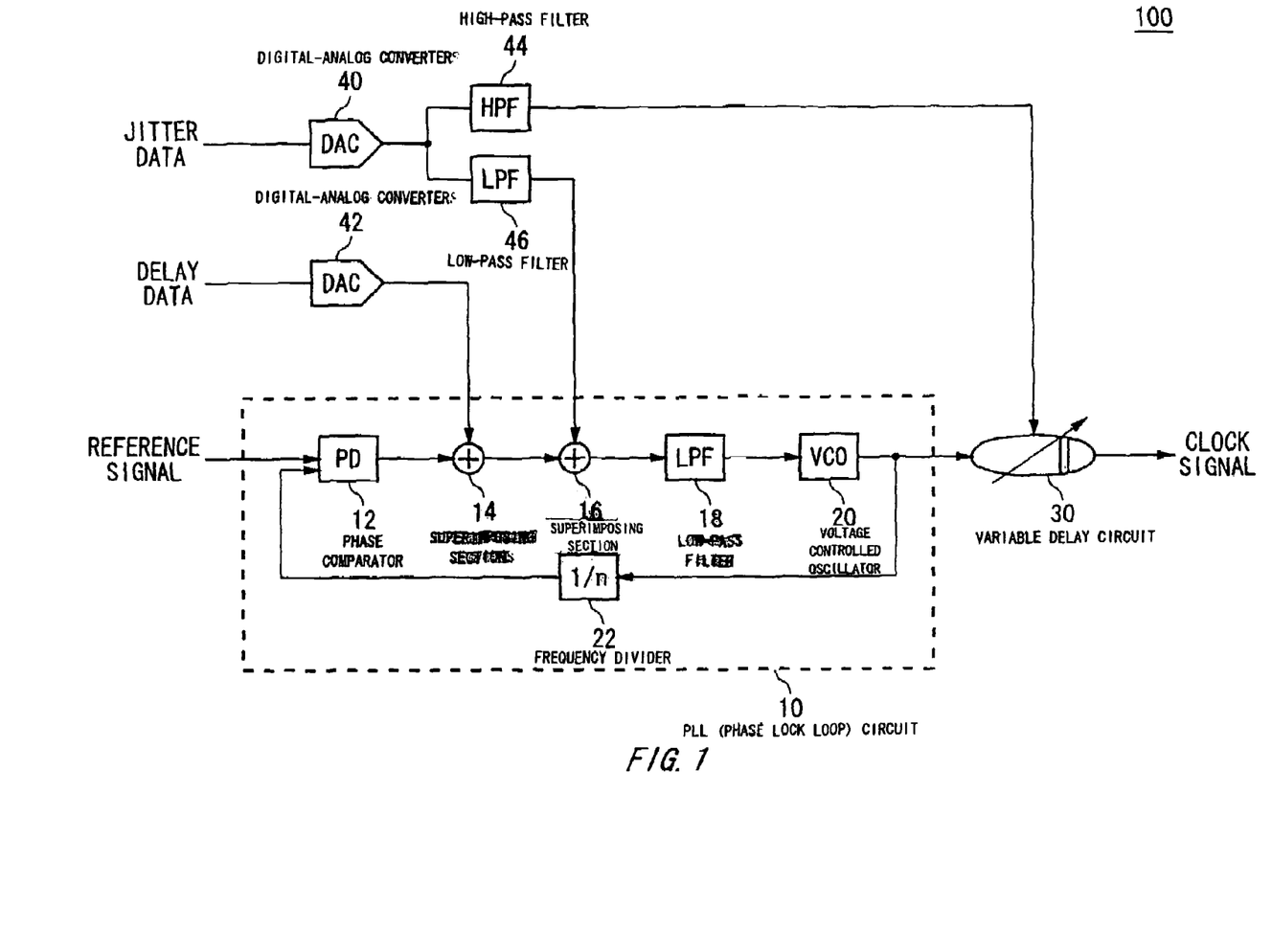
FIG. 1 is a diagram showing one exemplary configuration of a jitter application circuit 100 according to a mode for carrying out the invention.

FIG. 1 is a diagram showing one exemplary configuration of a jitter application circuit 100 according to a mode for carrying out the invention. The jitter application circuit 100 generates a clock signal containing a phase jitter component corresponding to given jitter data and outputs the clock signal containing the phase jitter component with desirable phase. The jitter application circuit 100 has a PLL (Phase Lock Loop) circuit 10, digital-analog converters 40 and 42 (hereinafter abbreviated as DACs 40 and 42), a high-pass filter 44, a low-pass filter 46 and a variable delay circuit 30. A delay for controlling the phase jitter component to be applied to the clock signal and for controlling the phase of the clock signal are given as digital jitter data and delay data in this example.

The PLL circuit 10 is a circuit for generating an oscillating signal corresponding to a given reference signal and has a phase comparator 12, superimposing sections 14 and 16, a low-pass filter 18, a voltage controlled oscillator 20 and a frequency divider 22.

The voltage controlled oscillator 20 generates the oscillating signal having frequency corresponding to a given control voltage. The voltage controlled oscillator 20 may be a ring oscillator, a low-frequency component tank circuit or the like. The phase comparator 12 generates the control voltage based on a result of comparison between the phase of the given reference signal and the phase of the oscillating signal generated by the voltage controlled oscillator 20. In this example, the phase comparator 12 compares the phase of the oscillating signal divided by the frequency divider 22 with a predetermined dividing ratio with the phase of the reference signal. The frequency divider 22 divides the oscillating signal with the dividing ratio by which the period of the oscillating signal given to the phase comparator 12 becomes almost identical with the period of the reference signal.

The superimposing section 14 superimposes voltage outputted from the DAC 42 to the control voltage outputted from the phase comparator 12. The DAC 42 receives delay data for delaying the clock signal to be outputted from the jitter application circuit 100 by a predetermined time and supplies voltage corresponding to the delay data to the superimposing section 14. The DAC 42 may receive the delay data of a constant value in this example.

The superimposing section 16 superimposes voltage outputted from the low-pass filter 46 to the control voltage. The DAC 40 outputs voltage corresponding to given jitter data and the low-pass filter 46 supplies a low-frequency component of the voltage outputted form the DAC 40 to the superimposing section 16. That is, the DAC 40, the low-pass filter 46 and the superimposing section 16 function as a low-frequency applying section for controlling oscillation frequency of the PLL circuit 10 based on the low-frequency component of the jitter data and for applying the low-frequency component of the phase jitter component to the oscillating signal.

Still more, among the frequency components of the voltage outputted from the DAC 40, the low-pass filter 46 supplies only frequency component which can be followed by the voltage controlled oscillator 20 to the superimposing section 16. The frequency band passed by the low-pass filter 46 is determined in advance corresponding to the characteristics of the PLL circuit 10. Further, the low-pass filter 46 may shift the level of the voltage to be passed to the level suitable for the control of the voltage controlled oscillator 20.

The low-pass filter 18 removes the high-frequency component of the control voltage to which the voltage corresponding to the low-frequency component of the delay data and the phase jitter component is superimposed and gives it to the voltage controlled oscillator 20. For instance, the frequency band passed by the low-pass filter 18 may be the same with the low-pass filter 18 and among the frequency component of the control voltage, only the frequency component corresponding to the characteristics of the voltage controlled oscillator 20 may be given to the voltage controlled oscillator 20.

Still more, when the low-frequency applying section inputs the control voltage to which the voltage corresponding to the jitter data has been superimposed to the low-pass filter 18 like the jitter application circuit 100 explained in this example, the jitter application circuit 100 needs not to have the low-pass filter 46. In case when the low-frequency applying section superimposes the voltage corresponding to the jitter data to the voltage outputted from the low-pass filter 46, it is preferable for the jitter application circuit 100 to have the low-pass filter 46.

The variable delay circuit 30 generates the clock signal of the delayed oscillating signal outputted from the PLL circuit 10. In this example, the variable delay circuit 30 is a circuit for delaying the signal for a time corresponding to given voltage. The jitter application circuit 100 applies the high-frequency component of the phase jitter component to be applied to the clock signal generated by the variable delay circuit 30 by controlling the delay of the variable delay circuit 30 corresponding to the high-frequency component of the jitter data. Still more, preferably, a response time of the variable delay circuit 30 when the setting of the delay of the variable delay circuit 30 is changed is shorter than a response time of the PLL circuit 10 when the control voltage fluctuates.

Based on the high-frequency component of the voltage outputted form the DAC 40, the high-pass filter 44 controls the delay of the variable delay circuit 30. That is, based on the high-frequency component of the jitter data, the DAC 40 and the high-pass filter 44 control the delay in the variable delay circuit 30 and function as a high-frequency applying section for applying the high-frequency component of the phase jitter component to the clock signal.

Still more, among the frequency component of the voltage outputted from the DAC 40, the high-pass filter 44 may pass only the frequency component which can be followed by the variable delay circuit 30 or may pass the component of the frequency band removed by the low-pass filter 46. The frequency band passed by the high-pass filter 44 is determined in advance corresponding to the characteristics and others of the PLL circuit 10. Still more, the high-pass filter 44 may shift the level of the voltage to be passed to level suitable for the control of the variable delay circuit 30.

The jitter application circuit 100 of the present embodiment separates the low-frequency component and high-frequency component of the phase jitter component to be applied and applies in the circuit corresponding to the respective frequency-bands of the phase jitter component. Therefore, it can apply the phase jitter component of the broad band. Still more, the amplitude of the high-frequency component of the phase jitter component is smaller as compared to that of the low-frequency component. Because the jitter application circuit 100 applies the smaller amplitude jitter component by using the variable delay circuit 30 and the larger amplitude jitter component by using the voltage controlled oscillator 20, it can apply the high-resolution and large-amplitude phase jitter component by using the variable delay circuit having the small circuit scale.

Still more, when jitter data is digital data of a plurality of bits denoted by binary digit for example, the high-frequency application section may control the delay in the variable delay circuit 30 based on the low-order bit of predetermined digit of the jitter data and the low-frequency application section may control the oscillation frequency of the PLL circuit 10 based on the upper-order bit of a predetermined digit of the jitter data. In this case, the jitter application circuit 100 needs not to have the DAC 40. Still more, preferably the low-pass filter 46 samples the upper-order bit of the given jitter data and supplies voltage corresponding to the data of the upper-order bit to the superimposing section 16. The digit of the bit sampled by the low-pass filter 46 is determined corresponding to the response characteristics of the voltage controlled oscillator 20.

Still more, the high-pass filter 44 samples the low-order bit of the given jitter data and controls the delay of the variable delay circuit 30 corresponding to the data of the low-order bit. When the variable delay circuit 30 is an analog voltage controlled circuit, preferably the high-pass filter 44 supplies voltage corresponding to the data of the low-order bit to the variable delay circuit 30. The number of digit sampled by the high-pass filter 44 is determined corresponding to the response characteristics of the variable delay circuit 30.

Figure 2:
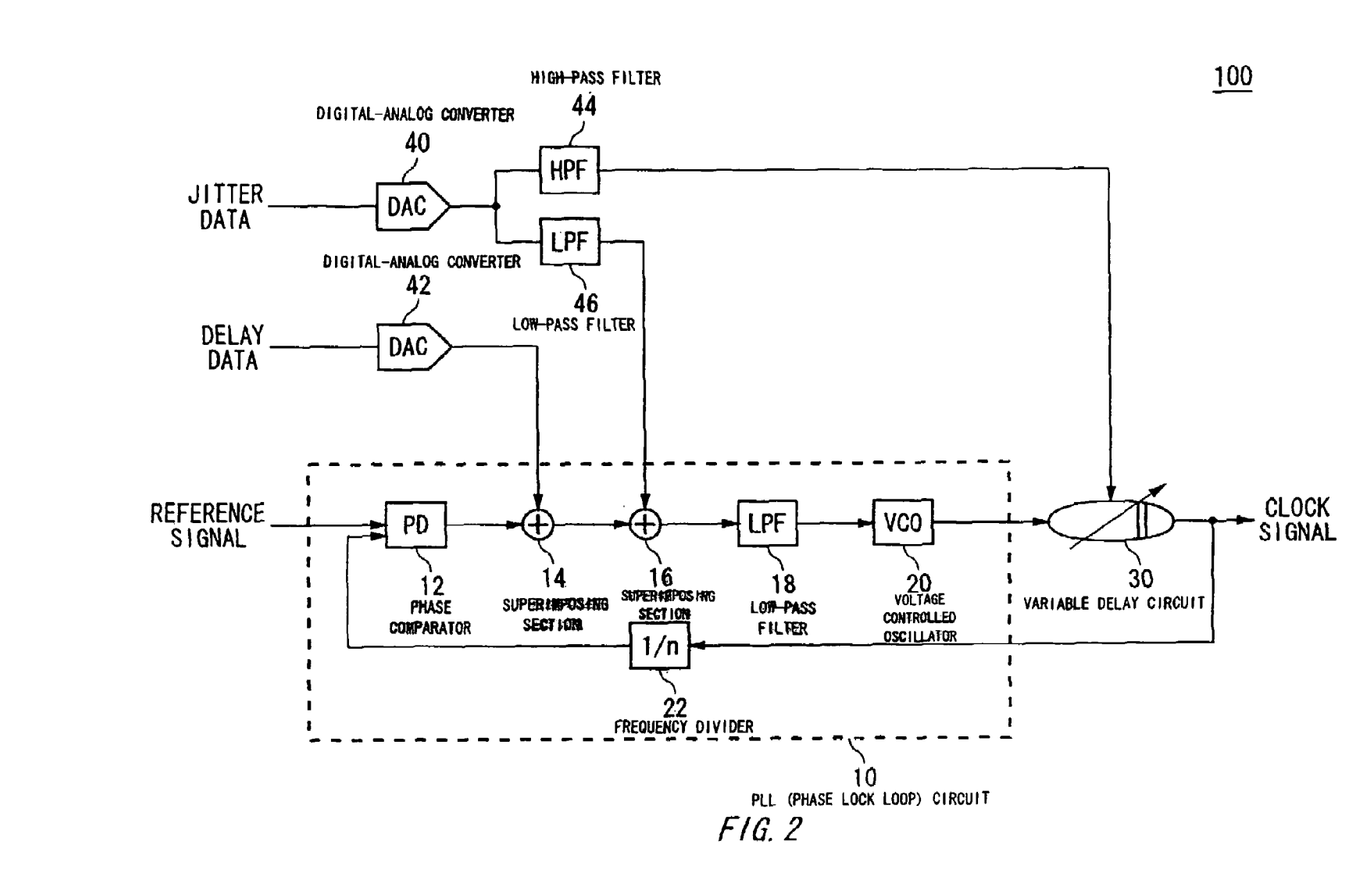
FIG. 2 is a diagram showing another exemplary configuration of the jitter application circuit 100.

FIG. 2 is a diagram showing another exemplary configuration of the jitter application circuit 100. In the jitter application circuit 100 of the present embodiment, the clock signal outputted by the variable delay circuit 30 is fed back to the phase comparator 12 via the frequency divider 22. That is, the phase comparator 12 generates control voltage based on a result of comparison between the phase of the given reference signal and the phase of the clock signal outputted from the variable delay circuit 30. The composition other than that is the same with the jitter application circuit 100 explained in FIG. 1, so that its explanation will be omitted here. Even when the delay characteristics of the variable delay circuit 30 fluctuates in elapse of time due to self-heating and to heat from the outside, such structure can reduce the influence of such fluctuation because the phase comparator 12 generates the control voltage that reduces such fluctuation.

Figure 3:
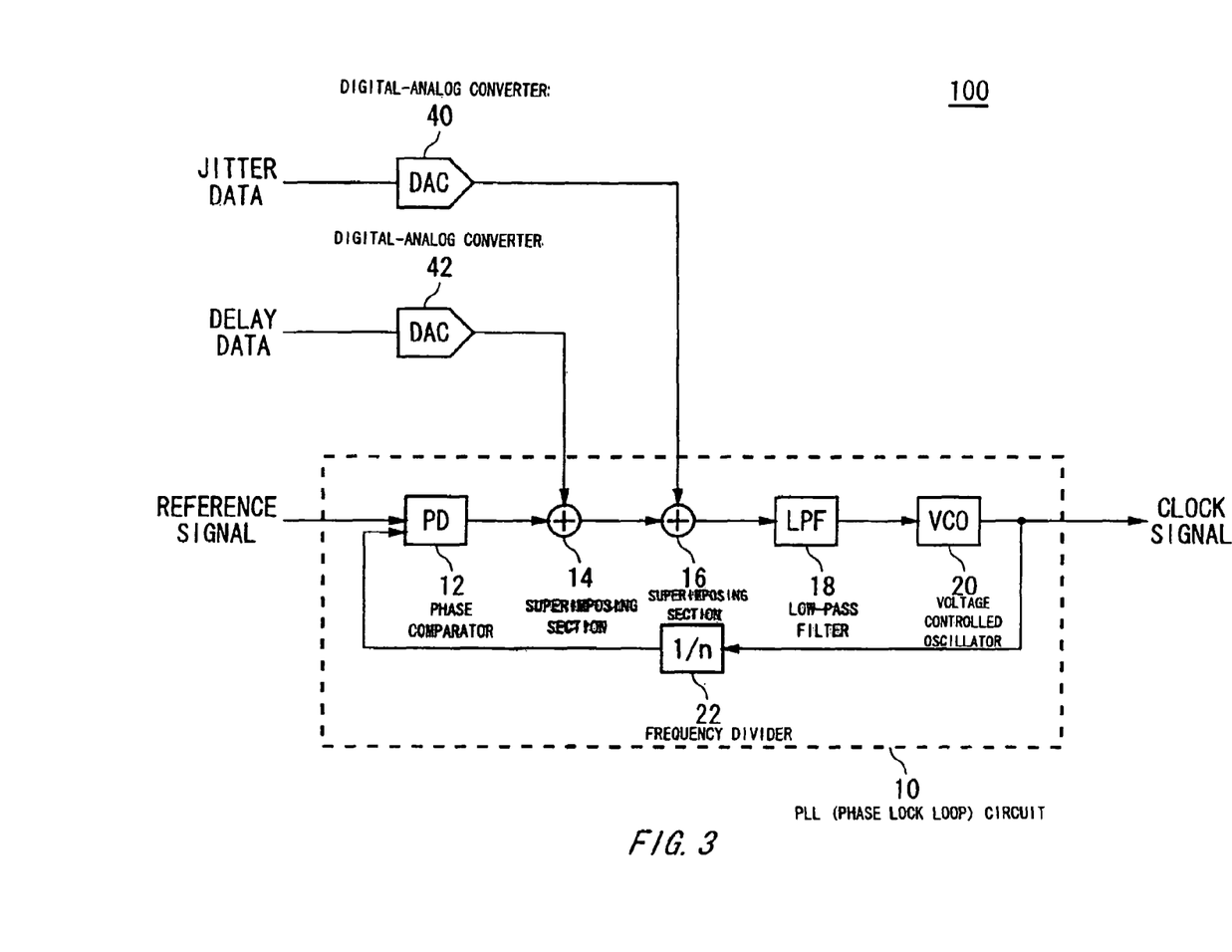
FIG. 3 is a diagram showing a still other exemplary configuration of the jitter application circuit 100.

FIG. 3 is a diagram showing a still other exemplary configuration of the jitter application circuit 100. The jitter application circuit 100 of the present embodiment has the PLL circuit 10, the DAC 40 and the DAC 42. The functions of the PLL circuit 10 and the DAC 40 are the same with the structural elements explained in FIG. 1 by denoting the same reference numerals, so that their explanation will be omitted here.

The DAC 40 supplies voltage corresponding to given jitter data to the superimposing section 16. The jitter application circuit 100 of the present embodiment can output the clock signal containing the phase jitter component with desired phase corresponding to the delay data by the simple structure.

Figure 4:
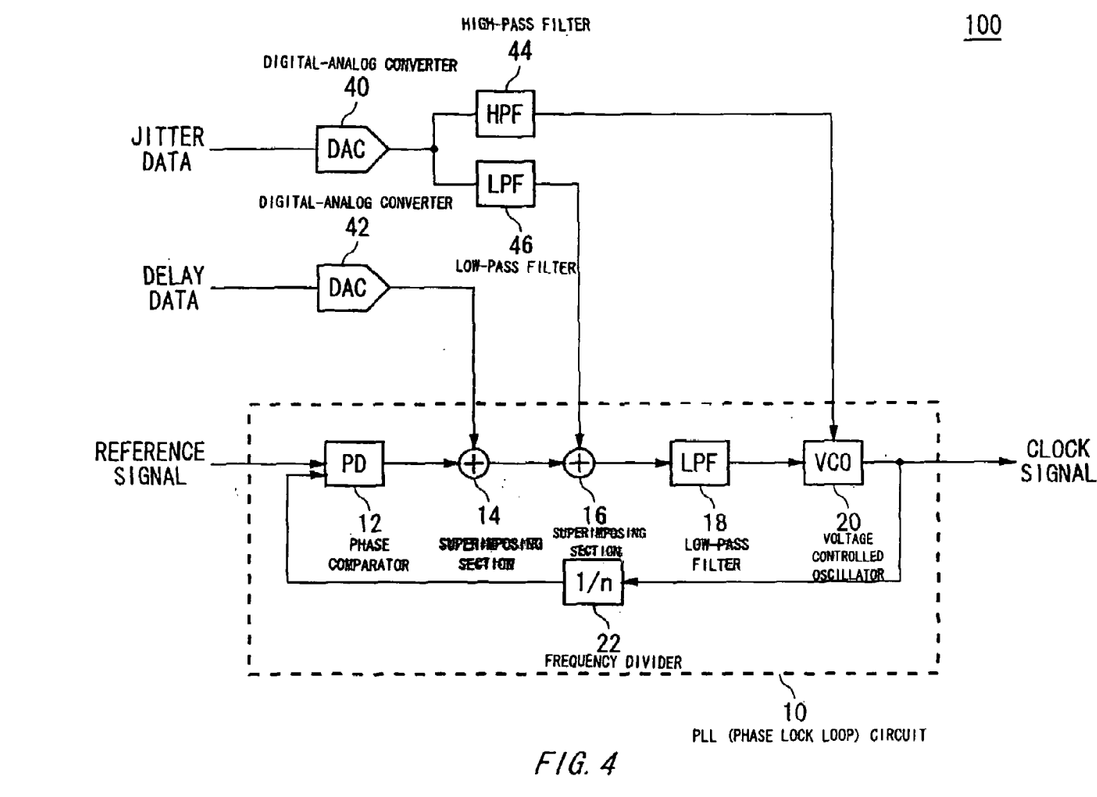
FIG. 4 is a diagram showing a further exemplary configuration of the jitter application circuit 100.

FIG. 4 is a diagram showing a further exemplary configuration of the jitter application circuit 100. The jitter application circuit 100 of the present embodiment has the PLL circuit 10, the DAC 40, the DAC 42, the high-pass filter 44 and the low-pass filter 46. The functions of the PLL circuit 10, the DAC 40, the DAC 42 and the low-pass filter 46 are the same with those structural elements explained in FIG. 1 by the same reference numerals, their explanation will be omitted here.

Based on the high-frequency component of the voltage outputted from the DAC 40, the high-pass filter 44 controls frequency in the voltage controlled oscillator 20. The jitter application circuit 100 of the present embodiment supplies the control voltage corresponding to the high-frequency component of the phase jitter component to be applied to the voltage controlled oscillator 20 without via the low-pass filter 18, it can apply phase jitter of broad band.

Figure 5:
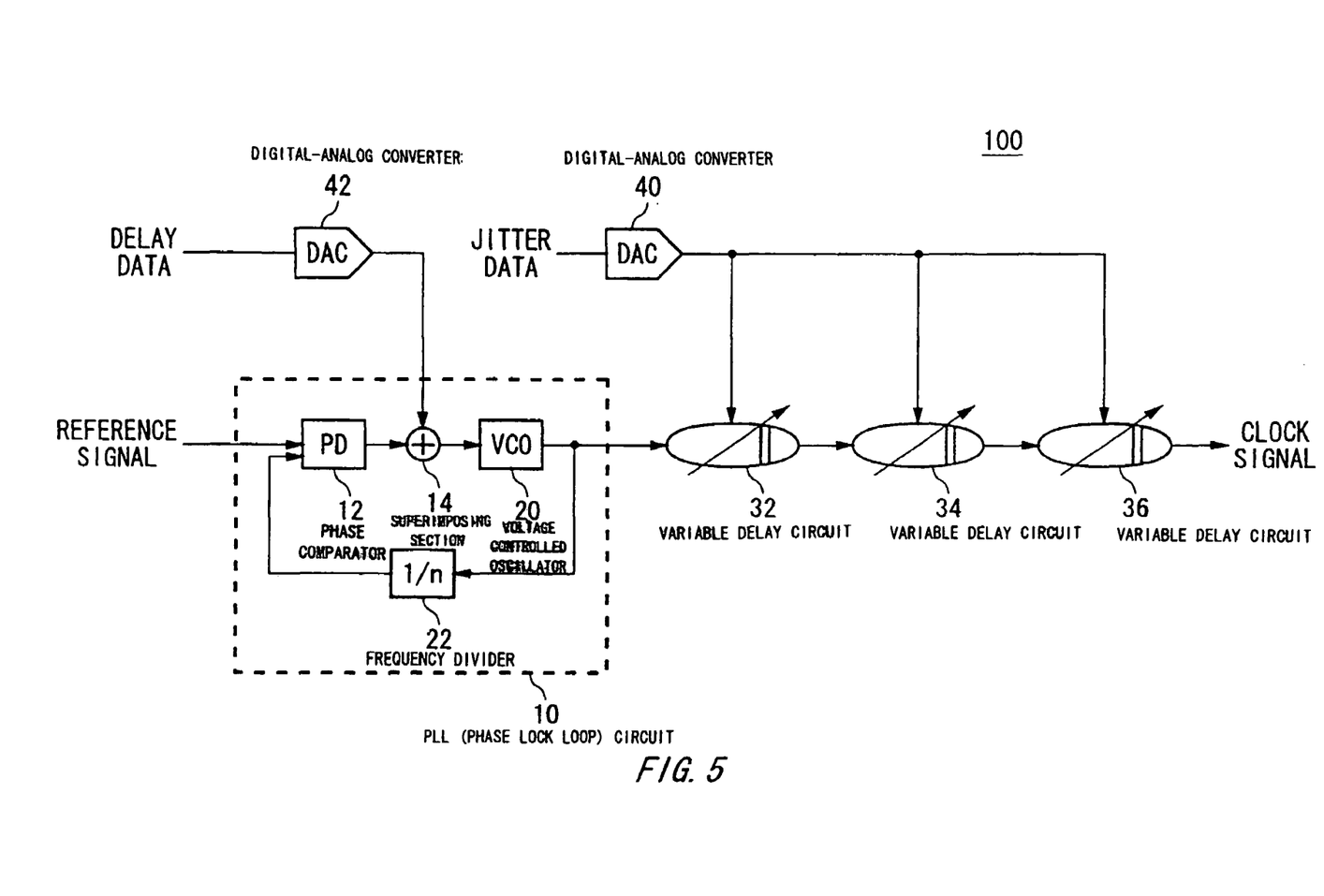
FIG. 5 is a diagram showing a still further exemplary configuration of the jitter application circuit 100.

FIG. 5 is a diagram showing a still further exemplary configuration of the jitter application circuit 100. The jitter application circuit 100 of the present embodiment has the PLL circuit 10, the DAC 40, the DAC 42 and a plurality of variable delay circuits (32, 34, 36) provided in series. The PLL circuit 10 generates an oscillating signal of predetermined frequency and the DAC 42 controls the phase of the oscillating signal corresponding to the given delay data.

The plurality of variable delay circuits (32, 34, 36) delay the oscillating signal with each different delay resolution. For instance, the maximum delay of the variable delay circuit 34 is almost equal with the delay resolution of the variable delay circuit 32 and the delay resolution is smaller than the delay resolution of the variable delay circuit 32. Still more, the maximum delay of the variable delay circuit 36 is almost equal with the delay resolution of the variable delay circuit 34 and the delay resolution is smaller than the delay resolution of the variable delay circuit 34. Such configuration enables the delay of the large delay range and high delay resolution to be generated with the small circuit scale.

Then, the DAC 40 applies the phase jitter component to the clock signals outputted from the plurality of variable delay circuits (32, 34, 36) by controlling the delay of the respective variable delay circuits (32, 34, 36) corresponding to the given jitter data. The jitter application circuit 100 may have means for controlling the respective variable delay circuits (32, 34, 36) by dividing the voltage outputted from the DAC 40 to a plurality of frequency bands corresponding to the plurality of variable delay circuits (32, 34, 36). For instance, the jitter application circuit 100 may further have means for controlling the variable delay circuit 32 by sampling low-frequency component of the voltage outputted from the DAC 40, means for controlling the variable delay circuit 34 by sampling middle-frequency component of the voltage outputted from the DAC 40 and means for controlling the variable delay circuit 36 by sampling the high-frequency component of the voltage outputted from the DAC 40. Such configuration allows the high-resolution and large-amplitude phase jitter component to be applied with the simple structure.

Figure 6:
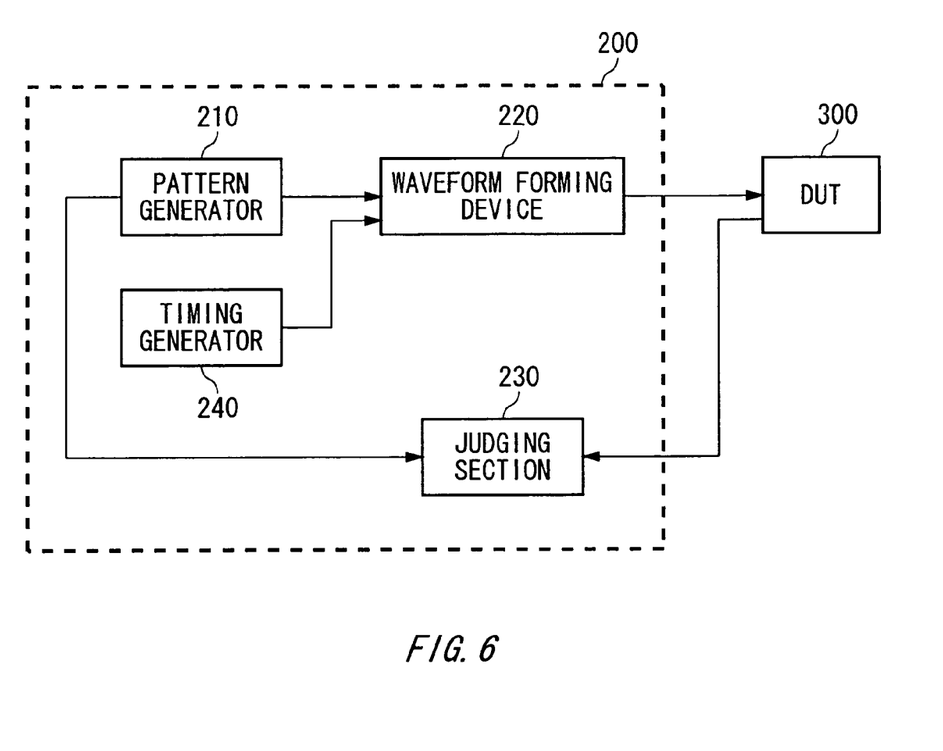
FIG. 6 is a diagram showing one exemplary configuration of a test apparatus 200 according to another mode for carrying out the invention.

FIG. 6 is a diagram showing one exemplary configuration of a test apparatus 200 according to another mode for carrying out the invention. The test apparatus 200 is an apparatus for testing jitter resistance of an electronic device 300 such as a semiconductor device and a receiving side device in high-speed serial communications and has a pattern generator 210, a waveform forming device 220, a judging section 230 and a timing generator 240.

The pattern generator 210 generates a test pattern for testing the electronic device 300. Here, the test pattern is an array of numerical values of 1 or 0 for example. The timing generator 240 generates a clock signal containing a phase jitter component corresponding to given jitter data. The timing generator 240 is the jitter application circuit 100 explained in FIGS. 1 through 5.

The waveform forming device 220 inputs a test signal based on the test pattern to the electronic device 300 with timing corresponding to the clock signal. That is, the waveform forming device 220 generates the test signal whose voltage level changes corresponding to the test pattern with the timing based on the clock signal and inputs it to the electronic device 300.

Corresponding to the output signal outputted from the electronic device 300 corresponding to the test signal, the judging section 230 judges the jitter resistance of the electronic device 300. For instance, the judging section 230 compares the output signal outputted from the electronic device 300 with an expected value signal given from the pattern generator 210 per amplitude of the phase jitter component applied by the timing generator 240 and judges whether or not the operation of the electronic device 300 is normal per amplitude of the phase jitter component.

As explained in FIGS. 1 through 5, the timing generator 240 can apply the broadband, high-resolution and large-amplitude phase jitter component readily to the clock signal, so that the electronic device 300 may be accurately tested. For instance, the test apparatus 200 of the present embodiment is very effective for the electronic device 300 used as a receiving side device of high-speed serial communications because the jitter resistance is an important test item.

Although the invention has been described by way of the exemplary embodiments, it should be understood that those skilled in the art might make many changes and substitutions without departing from the spirit and scope of the invention. It is obvious from the definition of the appended claims that the embodiments with such modifications also belong to the scope of the invention.

As it is apparent from the above description, the invention enables the broadband, high-resolution and large-amplitude phase jitter component to be applied readily to the clock signal.

What is claimed is:

1. A jitter application circuit for generating a clock signal containing a phase jitter component corresponding to given jitter data, comprising:
   a PLL circuit for generating an oscillating signal corresponding to a given reference signal;
   a variable delay circuit for outputting said clock signal of said delayed oscillating signal;
   a low-frequency application section for applying a low-frequency component of said phase jitter component to said oscillating signal by controlling oscillation frequency of said PLL circuit based on the low-frequency component of said jitter data; and
   a high-frequency application section for applying a high-frequency component of said phase jitter component to said clock signal by controlling a delay in said variable delay circuit based on the high-frequency component of said jitter data,
   wherein said PLL circuit has a voltage controlled oscillator for generating said oscillating signal having frequency corresponding to given control voltage;
   a phase comparator for generating said control voltage based on a result of comparison of the phase of the given reference signal and the phase of said oscillating signal; and
   a low-pass filter for removing the high-frequency component of said control voltage to give to said voltage controlled oscillator, and said low-frequency application section superimposes voltage corresponding to said jitter data to said control voltage generated by said phase comparator and inputs it to said low-pass filter, and
   wherein an oscillating signal generated by a voltage controlled oscillator is fed back to the phase comparator via a frequency divider, said feed back is performed inside of a PLL circuit.

2. The jitter application circuit as set forth in claim 1, wherein said high-frequency application section has a high-pass filter for sampling the high-frequency component of said jitter data.

3. The jitter application circuit as set forth in claim 2, wherein said low-frequency application section has a low-pass filter for sampling the low-frequency component of said jitter data.

4. The jitter application circuit as set forth in claim 1, wherein said jitter data is digital data of a plurality of bits;
   said high-frequency application section controls a delay in said variable delay circuit based on a low-order bit of a predetermined digit of said jitter data; and
   said low-frequency application section controls oscillation frequency of said PLL circuit based on upper-order bit of a predetermined digit of said jitter data.

5. A jitter application circuit for generating a clock signal containing a phase jitter component corresponding to given jitter data, comprising:
   a PLL circuit for generating an oscillating signal corresponding to a given reference signal;
   a variable delay circuit for outputting said clock signal of said delayed oscillating signal;
   a low-frequency application section for applying a low-frequency component of said phase jitter component to said oscillating signal by controlling oscillation frequency of said PLL circuit based on the low-frequency component of said jitter data; and
   a high-frequency application section for applying a high-frequency component of said phase jitter component to said clock signal by controlling a delay in said variable delay circuit based on the high-frequency component of said jitter data,
   wherein said PLL circuit has a voltage controlled oscillator for generating said oscillating signal having frequency corresponding to given control voltage;
   a phase comparator for generating said control voltage based on a result of comparison of phase of a given reference signal and phase of said clock signal outputted from said variable delay circuit;
   and a low-pass filter for removing the high-frequency component of said control voltage to give to said voltage controlled oscillator, and wherein a clock signal outputted by the variable delay circuit is fed back to the phase comparator via a frequency divider, said feed back is performed inside of a PLL circuit.

6. The jitter application circuit as set forth in claim 5, wherein said high-frequency application section has a high-pass filter for sampling the high-frequency component of said jitter data.

7. The jitter application circuit as set forth in claim 6, wherein said low-frequency application section has a low-pass filter for sampling the low-frequency component of said jitter data.

8. The jitter application circuit as set forth in claim 5, wherein said jitter data is digital data of a plurality of bits;
said high-frequency application section controls a delay in said variable delay circuit based on a low-order bit of a predetermined digit of said jitter data; and
said low-frequency application section controls oscillation frequency of said PLL circuit based on upper-order bit of a predetermined digit of said jitter data.

9. A test apparatus for testing jitter resistance of an electronic device, comprising:
a pattern generator for generating a test pattern for testing said electronic device;
a timing generator for generating a clock signal containing a phase jitter component corresponding to given jitter data; and
a waveform forming device for inputting the test signal based on said test pattern to said electronic device with timing corresponding to said clock signal:
said timing generator has a PLL circuit for generating an oscillating signal corresponding to a given reference signal;
a variable delay circuit for outputting said clock signal in which said oscillating signal is delayed; a low-frequency application circuit for controlling oscillation frequency of said PLL circuit based on the low-frequency component of said jitter data to apply the low-frequency component of said phase jitter component to said oscillating signal; and a high-frequency application section for controlling a delay in said variable delay circuit based the high-frequency component of said jitter data to apply the high-frequency component of said phase jitter component to said clock signal,
wherein said PLL circuit has a voltage controlled oscillator for generating said oscillating signal having frequency corresponding to given control voltage;
a phase comparator for generating said control voltage based on a result of comparison of the phase of the given reference signal and the phase of said oscillating signal;
and a low-pass filter for removing the high-frequency component of said control voltage to give to said voltage controlled oscillator, and said low-frequency application section superimposes voltage corresponding to said jitter data to said control voltage generated by said phase comparator and inputs it to said low-pass filter, and
wherein an oscillating signal generated by a voltage controlled oscillator is fed back to the phase comparator via a frequency divider, said feed back is performed inside of a PLL circuit.

10. A test apparatus for testing jitter resistance of an electronic device, comprising:
a pattern generator for generating a test pattern for testing said electronic device;
a timing generator for generating a clock signal containing a phase jitter component corresponding to given jitter data; and
a waveform forming device for inputting the test signal based on said test pattern to said electronic device with timing corresponding to said clock signal:
said timing generator has a PLL circuit for generating an oscillating signal corresponding to a given reference signal;
a variable delay circuit for outputting said clock signal in which said oscillating signal is delayed;
a low-frequency application circuit for controlling oscillation frequency of said PLL circuit based on the low-frequency component of said jitter data to apply the low-frequency component of said phase jitter component to said oscillating signal; and
a high-frequency application section for controlling a delay in said variable delay circuit based the high-frequency component of said jitter data to apply the high-frequency component of said phase jitter component to said clock signal,
wherein said PLL circuit has a voltage controlled oscillator for generating said oscillating signal having frequency corresponding to given control voltage;
a phase comparator for generating said control voltage based on a result of comparison of phase of a given reference signal and phase of said clock signal outputted from said variable delay circuit; and a low-pass filter for removing the high-frequency component of said control voltage to give to said voltage controlled oscillator, and
wherein a clock signal outputted by the variable delay circuit is fed back to the phase comparator via a frequency divider, said feed back is performed inside of a PLL circuit.

* * * * *